United States Patent [19]
Rawlins et al.

[11] Patent Number: 5,313,430
[45] Date of Patent: May 17, 1994

[54] POWER DOWN CIRCUIT FOR TESTING MEMORY ARRAYS

[75] Inventors: John R. Rawlins, Wallkill; Carlos G. Rivadeneira, Wappingers Falls, both of N.Y.

[73] Assignee: International Business Machines Corporation, Armonk, N.Y.

[21] Appl. No.: 987,923

[22] Filed: Dec. 9, 1992

[51] Int. Cl.[5] .............................................. G11C 11/40
[52] U.S. Cl. ................................... 365/229; 365/201; 365/200; 365/185
[58] Field of Search ................ 365/229, 185, 900, 200, 365/201; 371/21.1, 21.4, 28

[56] References Cited

U.S. PATENT DOCUMENTS 4,553,225 11/1985 Ohe ..................................... 371/21.4

Primary Examiner—Eugene R. LaRoche
Assistant Examiner—Huan Hoang
Attorney, Agent, or Firm—Whitham & Marhoefer

[57] ABSTRACT

A power down circuit for a default detection circuit, for detecting defects in memory array cells, comprising means for diverting the memory array standby current around the memory array cells to achieve the maximum ratio of change in input voltage as compared to the change in cell standby current and to provide improved tracking of the memory array over statistical variations of temperature, power supplies, process and other variables.

5 Claims, 3 Drawing Sheets

POWER DOWN CIRCUIT FOR TESTING MEMORY ARRAYS

DESCRIPTION

Background of the Invention

1. Field of the Invention

The present invention generally relates to a system for detecting defects in memory array cells and, more specifically, to a power down generator for controlling the amount of cell standby current which is diverted from the memory array cells when powering down the memory arrays to achieve the maximum ratio of change in input voltage as compared to the change in cell standby current.

2. Description of the Prior Art

A number of techniques have been developed for determining the reliability of integrated circuit (IC) semiconductor memories, and most generally use a procedure for lowering the supply voltage of the entire semiconductor device below the operation range of the memory cell to detect the failure of any cells. This procedure, however, would not detect, in most instances, weak cells that do not fail when the supply voltage is reduced below the operating level of the memory cell. It is essential, then, to power down a memory array, well below the operating level, in order to identify and locate bad and weak memory cells.

The prior art is replete with techniques using high voltages (in the neighborhood of 3.6 volts) which necessitates a power supply bus to handle the power down current during the test procedure as well as suffering from a narrow power down voltage control range of perhaps 0 volts to 1.5 volts. Another typical problem exists when using only a single array cell in the power down scheme, which results in a high current density and an increase in mistracking.

The nominal standby current in memory arrays is typically defined by fixed current sources located in the lower or upper word-lines, with a circuit designed for use with a very low voltage differential. Therefore, the design of a voltage controlled current source that will vary the standby current of the cells is very complicated.

As the size and density of the arrays increase, the peripheral circuits that control the power down level and the cells are much farther away, making the tracking of such circuits more difficult to achieve.

As the number of cells increase in the cell matrix to improve voltage drop on word-lines, the positioning of the standby current circuit requires the cells to be spaced away from low resistance power lines. This condition requires special high power lines just to be able to reroute the standby current away from the cells during a power down operation.

The control of the amount of power down current during a power down operation is directly related to the ratio of change of input power down voltage to cell standby current, which typically is very low and directly contributes to the inefficiency of a small, linear operating range between power supplies.

SUMMARY OF THE INVENTION

It is therefore an object of the present invention to provide a technique for detecting and locating weak and bad cells in an IC semiconductor memory array.

It is another object of the invention to provide a power down circuit which will track with the memory array over statistical variations of temperature, power supplies, process and other variables.

It is still another object of the invention to provide a power down circuit which will track with the array cell voltage drop along with the word-line and drain-line voltages.

It is yet another object of this invention to provide a practical way of diverting standby current away from the array without having to use metal busses to handle the power down current.

It is a further object of this invention to provide a power down circuit that will allow one to after the cell standby current in the array from full cell standby current to zero (fully powered down).

According to this invention, there is provided a power down circuit for detecting any defects in the cells of an integrated circuit semiconductor memory array, whereby during the power down process, some or all of the standby current is steered around the memory array cells from the upper word-lines to the lower word-lines (drain lines) to provide a large ratio of analog input voltage control over the standby current.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
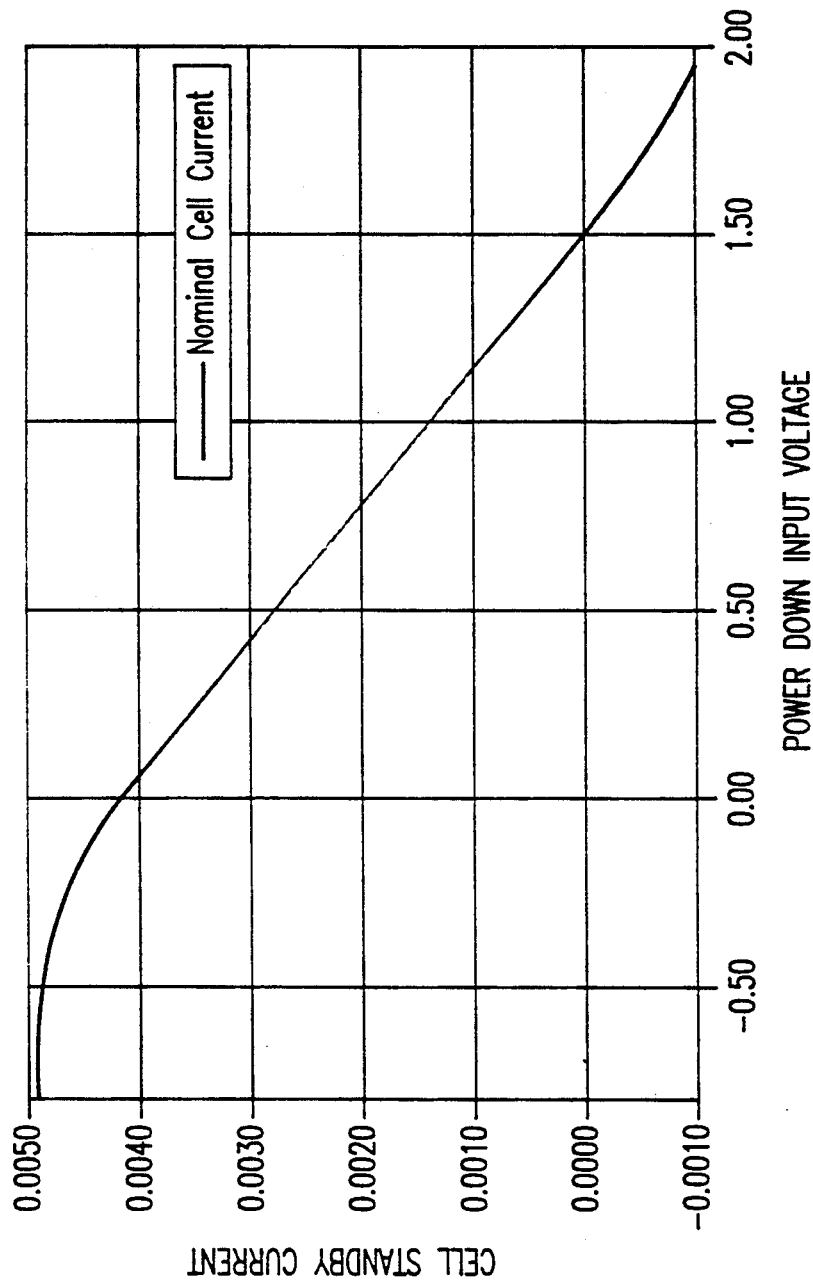
FIG. 1 is a graph which shows the power down circuit's operation characteristic curve of the memory cell standby current as a function of power down input analog voltage.

Referring now to the drawings, and more particularly to FIG. 1, the graph shows how the standby current of the array cell standby current falls almost linearly as the power down input analog voltage is varied from −0.5 volts to +2.0 volts in the practice of the invention. The power down circuit which accomplishes this operation is shown in FIG. 2.

Figure 2:
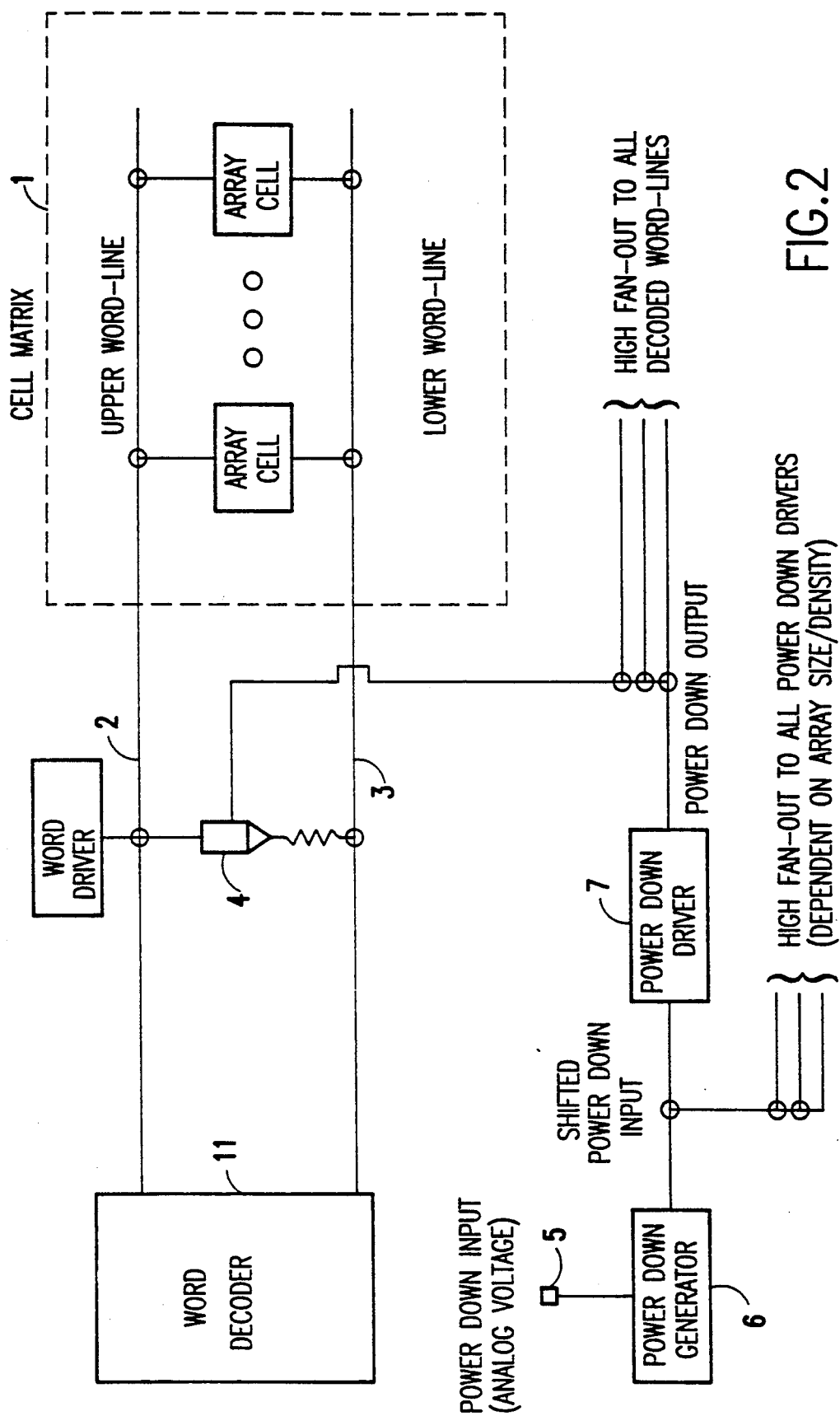
FIG. 2 is a block diagram depicting circuitry capable of accomplishing the operation shown in FIG. 1.

With particular reference to FIG. 2, there is shown a plurality of memory array cells within the cell matrix 1, each being connected across upper word-line 2 and lower word-line (drain-lines) 3 which provide a standby current for the memory array. In order to test the memory array for defective cells, it is necessary to have the memory array functioning at its normal operating level, whereupon the standby current is reduced below the operating level of the memory array and then brought back up to the normal operating level. Those weak and defective cells within the memory array will become obvious upon bringing the memory array back up to operational level as they will no longer be operational.

When the cell matrix I is powered down, it is essential to be able to control the power down current flow without having to provide bulky busses to handle the load and protect the memory cells. Here we provide a circuit for diverting the standby current around the cell matrix from the upper word-lines 2 to the lower word-lines 3, through a transistor-resistor circuit, whereby the transistor 4 is triggered into a state of conduction by the application of a power down input analog voltage to input terminal 5 of the power down generator 6, which provides a power down input signal to a power down driver 7, in each of a plurality of power down circuits. Each power down driver 7 provides a power down output signal to the diverter circuit of the set of word and drain-lines for each of the decoder word-line circuits.

The degree of power down, or reduction in cell standby current, is shown in FIG. 1 to be directly related to the level of input voltage applied to the input terminal of the power down generator. As the input voltage is varied from −0.5 volts to +2.0 volts the array cell standby current varies from about 5 milliamps to around −1 milliamps. The power down generator circuit drives a number of power down circuits distributed around the chip.

Figure 3:
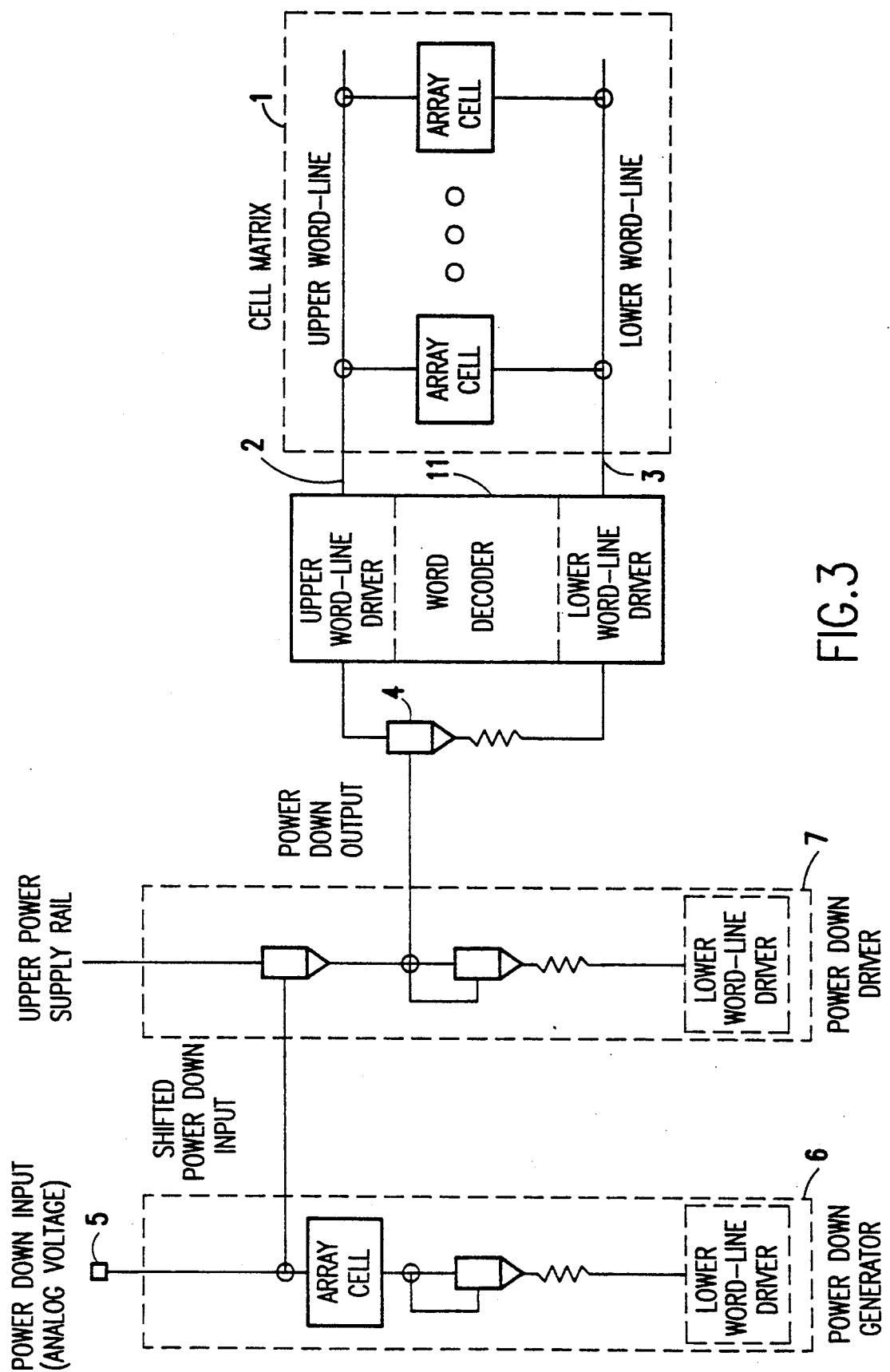
FIG. 3 schematic and block diagram of specific circuitry for effecting better tracking, steering power down current away from the memory cells and eliminating the need for wide high power supply busses.

Referring now to FIG. 3, the same basic power down circuit as described in FIG. 2 is shown with the added feature of providing duplicate word-line drivers and the same transistor-resistor pair 4 for the power down generator 6, the power down driver 7, and word decoder 11, respectively, in order to maximize the ratio between the analog (power down input) voltage to cell standby current. The power down generator 6 also includes array cells to optimize tracking during power down.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A fault detection circuit for locating defective memory array cells, comprising:

at least one pair of current busses, wherein the first bus functions as a word-line bus and the second bus functions as a drain-line bus;

a plurality of parallel IC memory array cells coupled across the busses, whereby a standby current is provided at the word-line bus for the memory array;

a word decoder coupled across the word-line and drain-line busses, and a word driver coupled to the word-line bus, which jointly provide word-line selection in the memory array cells;

means for varying the array memory cell standby current in a power down operation; and means for diverting said standby current around the memory array cells to said drain-line bus during the power down operation.

2. The fault detection circuit of claim 1, wherein the means for diverting the standby current around the memory array cells is comprised of a series transistor - resistor circuit coupled across the word-line and drain-line busses in parallel relation to the plurality of memory array cells.

3. The fault detection circuit of claim 2, wherein the means for varying the standby current is a power down generator which is responsive to a power down input analog voltage to control the conductivity of the transistor in the diverting circuit to effect a reduction in the standby current during the power down operation.

4. The fault detection circuit of claim 3, wherein a power down driver circuit is used in the circuit between the power down generator and the current diverter means to assure that the same change in current as seen at the power down generator circuit is transmitted to the array standby cells.

5. The fault detection circuit of claim 4, wherein duplicated drain-line drivers are provided in the power down generator, the power down driver and the word decoder in order to assure that all the circuits will track to control the standby current across the entire memory array, in such a way that one can alter the memory cell standby current in the array from full cell standby current to a fully powered down state.

* * * * *